(12) United States Patent
Bardouillet et al.

(10) Patent No.: US 7,178,113 B2
(45) Date of Patent: Feb. 13, 2007

(54) IDENTIFICATION OF AN INTEGRATED CIRCUIT FROM ITS PHYSICAL MANUFACTURE PARAMETERS

(75) Inventors: Michel Bardouillet, Rousset (FR); Luc Wuidart, Pourrieres (FR)

(73) Assignee: STMicroelectronics S.A., Montrouge (FR)

( * ) Notice: Subject to any disclaimer, the term of this patent is extended or adjusted under 35 U.S.C. 154(b) by 352 days.

(21) Appl. No.: 10/473,058

(22) PCT Filed: Apr. 4, 2002

(86) PCT No.: PCT/FR02/01192

§ 371 (c)(1),
(2), (4) Date: Feb. 6, 2004

(87) PCT Pub. No.: WO02/082448

PCT Pub. Date: Oct. 17, 2002

(65) Prior Publication Data

US 2004/0125930 A1    Jul. 1, 2004

(30) Foreign Application Priority Data

Apr. 4, 2001    (FR) .................................. 01 04585

(51) Int. Cl.
*G06F 17/50* (2006.01)
*H03K 19/173* (2006.01)

(52) U.S. Cl. ................................. 716/1; 716/6; 326/47
(58) Field of Classification Search .................... 716/1, 716/4, 6; 327/261, 269; 326/40–41, 46, 326/47

See application file for complete search history.

(56) References Cited

U.S. PATENT DOCUMENTS

| | | | |
|---|---|---|---|
| 3,911,368 A | 10/1975 | Tarczy-Hornoch | |
| 4,023,110 A | 5/1977 | Oliver | |
| 4,675,612 A | 6/1987 | Adams et al. | |
| 5,049,766 A * | 9/1991 | van Driest et al. | 327/269 |
| 5,204,559 A | 4/1993 | Deyhimy et al. | |
| 5,467,304 A * | 11/1995 | Uchida et al. | 365/174 |
| 5,608,645 A | 3/1997 | Spyrou | |
| 5,663,767 A * | 9/1997 | Rumreich et al. | 348/537 |
| 5,686,850 A | 11/1997 | Takaki et al. | |
| 5,867,453 A * | 2/1999 | Wang et al. | 368/120 |
| 6,414,530 B2 * | 7/2002 | Noda et al. | 327/269 |
| 6,496,035 B2 * | 12/2002 | Jensen et al. | 326/47 |

(Continued)

OTHER PUBLICATIONS

International Search Report from the corresponding International Application No. PCT/FR02/01192.

(Continued)

*Primary Examiner*—Stacy A Whitmore
(74) *Attorney, Agent, or Firm*—Lisa K. Jorgenson; James H. Morris; Wolf, Greenfield & Sacks, P.C.

(57) ABSTRACT

The invention concerns an identification method and circuit (1) of the network type of parameters contained in an integrated circuit chip, comprising a single input terminal (2) for applying a signal (E) triggering an identification, the output terminals ($3_1$, $3_2$, $3_{i-1}$, $3_i$, $3_{n-1}$, $3_n$) adapted to deliver a binary identifying code ($B_1$, $B_2$, $B_{i-1}$, $B_i$, $B_{n-1}$, $B_n$), first electrical paths $P_1$, $P_2$, $P_i$, $P_n$), individually connecting said input terminal to each output terminal, and means (4, $5_1$, $5_2$, $5_i$, $5_n$) for simultaneously integrating the binary states present in output of the electrical paths, each path inputting a delay sensitive to technological dispersions and/or of the integrated circuit fabrication method.

26 Claims, 1 Drawing Sheet

U.S. PATENT DOCUMENTS

| | | | |
|---|---|---|---|
| 6,795,931 B1* | 9/2004 | LaBerge | 713/401 |
| 6,828,839 B2* | 12/2004 | Saeki | 327/269 |
| 2001/0015666 A1* | 8/2001 | Noda et al. | 327/269 |
| 2001/0050952 A1 | 12/2001 | Nikutta | |
| 2005/0242864 A1* | 11/2005 | Kawasaki et al. | 327/261 |

OTHER PUBLICATIONS

U.S. Appl. No. 10/473,057, filed Feb. 10, 2004, Michel Bardouillet et al.

\* cited by examiner

IDENTIFICATION OF AN INTEGRATED CIRCUIT FROM ITS PHYSICAL MANUFACTURE PARAMETERS

BACKGROUND OF THE INVENTION

1. Field of the Invention

The present invention relates to the identification of an electronic component or assembly based on parameters linked to the manufacturing of an identification circuit contained in an integrated circuit chip. Such an identification generally uses a network of physical parameters (PPN) linked to the manufacturing of the integrated circuit chip. This identification is currently designated as an "integrated circuit fingerprint" identification.

2. Discussion of the Related Art

A first family of known identification methods consists of measuring electric parameters of the integrated circuit chip. It may be, for example, a measurement of a threshold voltage of a transistor, a resistance measurement or a stray capacitance measurement. Since these features are sensitive to technological and manufacturing process dispersions, it can be considered that the electric parameter(s) taken into account are specific to a manufacturing and form a "signature" of the integrated circuit resulting from this manufacturing. An example of a method using a measurement of electric parameters is described in U.S. Pat. No. 6,161,213 which is incorporated herein by reference.

A disadvantage of the use of an electric parameter measurement is that these values vary along time (during the circuit lifetime). Accordingly, the obtained signature is not stable.

Another disadvantage is that it is necessary to calculate the difference between a measured signature (for example, the voltage across a capacitor) and a predefined signature. It is accordingly necessary to have an analog-to-digital converter to convert the measured signals before calculating their difference enabling identification.

In addition to stability problems, the converter needs to be very accurate due to the small variations to be measured. Indeed, the technological dispersions involved are, by nature, very small (for example, for the threshold voltage of a MOS transistor, the dispersion generally is +/−4 millivolts. For a voltage measurement, a difference smaller than one millivolt over a range of values of approximately 200 millivolts may have to be detected. For such an example, a 12-bit converter is necessary.

Another disadvantage is that, for reliability reasons, it is often necessary to examine several points in the circuit. This accordingly requires an analog multiplexer, or increasing the number of used converters.

A second family of known solutions uses a time measurement. For example, the read/write time of an EEPROM-type memory is measured. An example of an identification method using an operation execution time measurement is described in U.S. Pat. No. 5,818,738 which is incorporated herein by reference.

This family of solutions has the same disadvantages as the former. The difference is that the converter is replaced with a counter.

Be it in the first or in the second solution family, a measurement is used and the obtained signature is compared with a standard value stored either in the integrated circuit or in an external device in the case of an authentication with respect to distant elements.

All these solutions thus have the major disadvantage of being bulky and difficult to implement for an uncertain result.

SUMMARY OF THE INVENTION

The present invention aims at providing a novel manner of performing an identification of an electronic assembly or component based on physical parameters of an integrated circuit chip contained therein. The present invention aims, more specifically, at providing a novel identification method as well as a novel identification circuit of physical parameter network type, which overcomes at least one of the disadvantages of known methods and circuits.

The present invention also aims at providing a solution which avoids use of analog-to-digital converters or counters.

The present invention also aims at providing a solution taking up a small integration surface area.

The present invention also aims at providing a solution which is particularly sensitive to technological and manufacturing process dispersions, while being stable in time.

The present invention further aims at providing a solution which is compatible with an internal or external processing of the obtained identification code.

To achieve these objects, the present invention provides an identification circuit of physical parameter network type contained in an integrated circuit chip, including:

a single input terminal of application of a signal for triggering an identification;

output terminals adapted to providing a binary identification code;

first electric paths individually connecting said input terminal to each output terminal, each path introducing a delay sensitive to technological and/or manufacturing process dispersions of the integrated circuit; and means for simultaneously taking into account binary states present at the outputs of the electric paths.

According to an embodiment of the present invention, each electric path is formed of a delay element and of a flip-flop having an input terminal connected at the output of the corresponding delay element and having an output terminal defining one of the output terminals of the identification circuit.

According to an embodiment of the present invention, said means for taking into account include a second electric path introducing a delay approximately corresponding to the average delay of the delays introduced by said first paths, said second path being interposed between said input terminal and a terminal for triggering the taking into account of said binary states.

According to an embodiment of the present invention, the clock inputs of the different flip-flops are all connected to said triggering terminal.

According to an embodiment of the present invention, the electric paths are chosen to introduce delays of the same order of magnitude, despite technological dispersions.

The present invention also provides a method for identifying an integrated circuit chip based on these physical parameters sensitive to technological dispersions, consisting of comparing an average travel duration of a digital signal with respect to at least two other electric paths of the same digital signal.

According to an embodiment of the present invention, the taking into account of the comparisons is synchronized based on the digital input signal.

The foregoing objects, features and advantages of the present invention, will be discussed in detail in the following non-limiting description of specific embodiments in connection with the accompanying drawings, in which:

DETAILED DESCRIPTION

Figure 1:
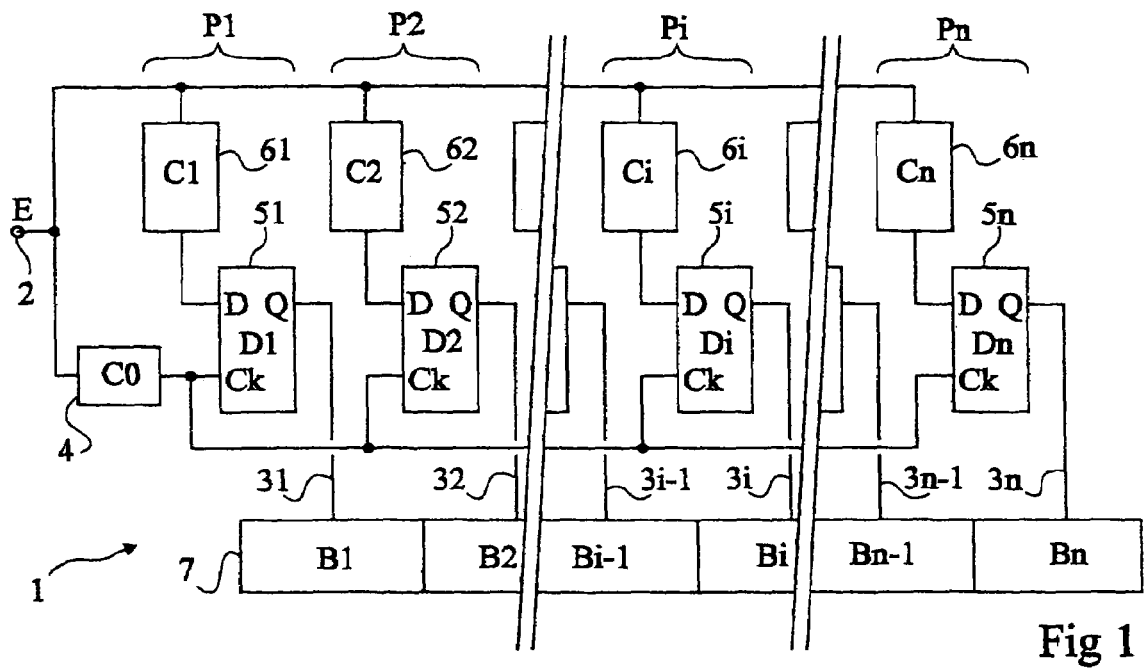
FIG. 1 shows an embodiment of an integrated identification circuit according to the present invention.

For clarity, only those elements that are necessary to the understanding of the present invention have been shown in the drawings and will be described hereafter. In particular, the destination and the exploitation made of the identification code obtained by the implementation of the present invention have not been detailed. Further, the triggering of an identification routine by means of an integrated circuit according to the present invention may be performed similarly to conventional solutions, which are not detailed.

A feature of the present invention is to submit a same input signal (a logic signal including at least one edge) to several different delays coming from electric paths each introducing a delay sensitive to technological and/or manufacturing process dispersions.

Another feature of the present invention is not to measure the effects of technological dispersions in terms of time difference by to provide a direct comparison of the delays introduced by the different paths with respect to an average delay.

FIG. 1 shows the electric diagram of an embodiment of an integrated identification circuit according to the present invention.

In this example, circuit 1 includes a single input terminal 2 intended to receive a digital signal E for triggering an identification. To implement the present invention, signal E must include, as will be seen hereafter in relation with FIGS. 2A and 2B, at least one edge by identification.

The function of identification circuit 1 is to provide a binary code $B_1$, $B_2$, . . . , $B_{i-1}$, $B_i$, . . . , $B_{n-1}$, $B_n$ over a predetermined number of bits, this code being sensitive to technological and circuit manufacturing process dispersions. Each bit $B_i$ is provided on a terminal $3_1$, $3_2$, . . . , $3_{i-1}$, $3_i$, . . . , $3_{n-1}$, $3_n$ of circuit 1 which is specific to it. Circuit 1 thus provides the identification code in parallel form.

According to the present invention, to each identification bit $B_i$ is associated an electric path $P_1$, $P_2$, . . . $P_i$, . . . $P_n$ connecting common input terminal 2 to a terminal $3_i$ of same rank.

Preferably, the delays introduced by the different electric paths $P_i$ are chosen to be slightly different from one another to guarantee a sensitivity to the technological dispersions of the manufacturing process.

It can thus be seen that, by the different delays introduced by the electric paths, the edge triggering input signal E is reproduced on the different outputs at different times.

According to the present invention, it is provided to read the information present at the outputs of circuit 1 in a synchronized way and at a time approximately corresponding to the theoretical average delay between the different electric paths.

More specifically, according to the preferred embodiment of the present invention illustrated in FIG. 1, an average electric path 4 (C0) is provided to set the read time from the occurrence of the edge triggering input signal E.

For example, path 4 connects input 2 of circuit 1 to the terminals Ck of flip-flops $5_1$, $5_2$, . . . , $5_i$, . . . , $5_n$ belonging to the respective electric paths $P_1$, $P_2$, . . . , $P_i$, . . . , $P_n$ and the respective Q outputs of which form output terminals $3_1$, $3_2$, . . . $3_i$, . . . , $3_n$ of circuit 1. According to this embodiment, each electric path $P_i$ includes a delay element $6_1$ (C1), $6_2$ (C2), . . . , $6_i$ (Ci) . . . , $6_n$ (Cn) connecting input 2 of the circuit to the D input of the corresponding flip-flop in the path. Delay elements $6_i$ are the elements exhibiting, according to the present invention, different delays with respect to one another. Indeed, flip-flops $5_i$ all preferably have the same structure. They however take part in the delay brought to the input signal until it reaches the respective output terminals of circuit 1 with respect to the average delay C0 introduced by element 4.

When an edge is applied on input signal E, this edge reaches the respective D inputs of the flip-flops at different times. The reading of the input state of the different flip-flops is synchronized by the edge of signal E delayed, this time, by element 4. For this reason, in particular, a delay C0 approximately corresponding to the average delay of the different elements $6_i$ is chosen.

In the example of FIG. 1, the different outputs 3i of circuit 1 are individually connected at the input of a register 7 for storing the obtained binary code, each bit $B_i$ corresponding to one of the circuit outputs. The connection and structure details of register 7 have not been described in detail. Once the binary code is contained in this register, its exploitation depends on the application, and its implementation is within the abilities of those skilled in the art.

Figure 2A:
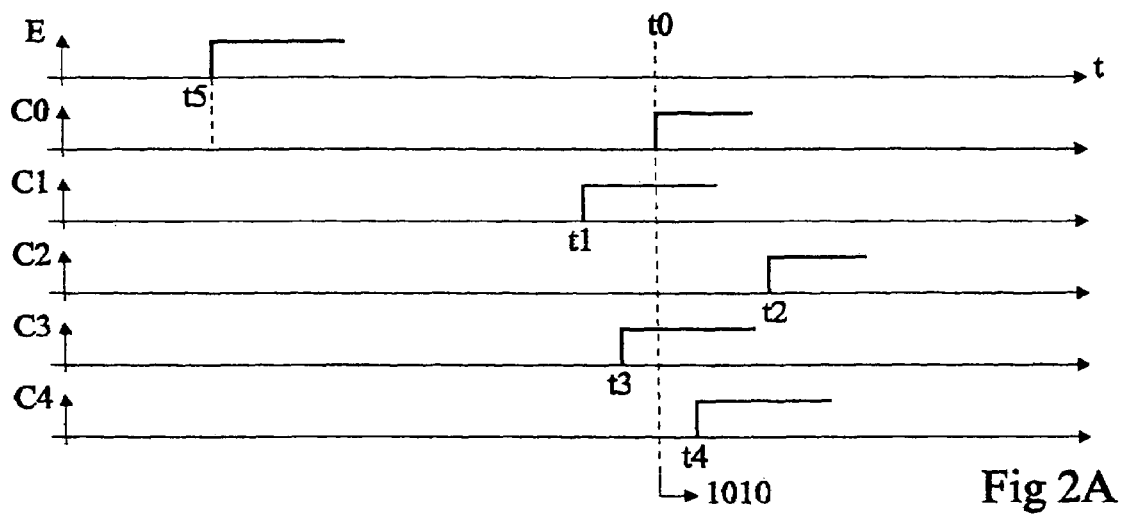
FIGS. 2A and 2B illustrate, in the form of timing diagrams, the operation of the identification circuit of FIG. 1, for two different integrated circuits.
Figure 2B:
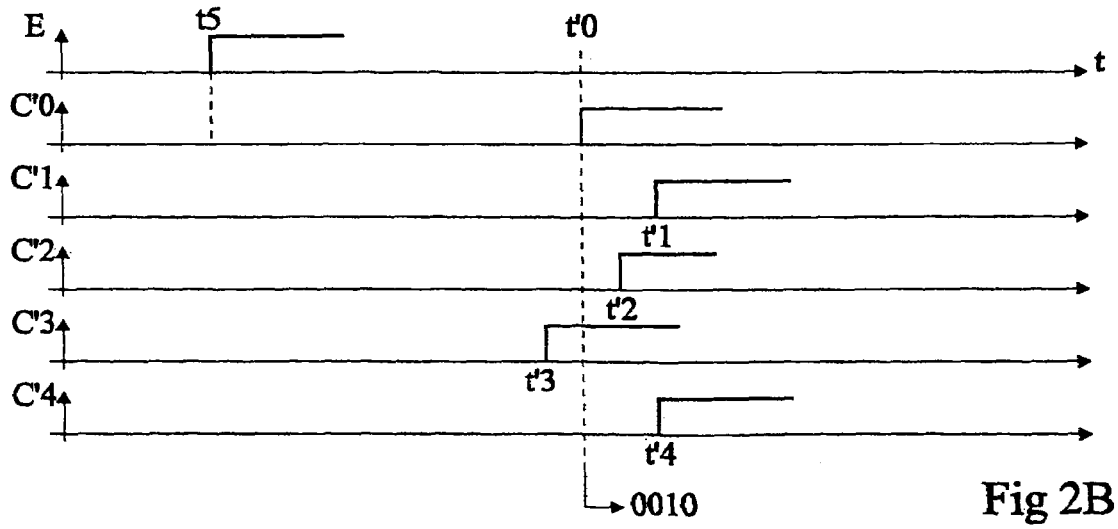

FIGS. 2A and 2B illustrate, in the form of timing diagrams and without any scale consideration, the operation of an identification circuit according to the present invention. FIGS. 2A and 2B show examples of shapes of signal E, and output signals of the different delay elements. In the example of FIGS. 2A and 2B, the case of a binary code over four bits is considered. The timing diagrams have been designated with references C0, C1, C2, C3, and C4.

The difference between FIGS. 2A and 2B represents the difference between two circuits 1 integrated on chips coming from different manufacturing processes.

In FIG. 2A, it is assumed that at a time t5, a rising edge is triggered on signal E. This edge appears on the different inputs of the D flip-flops (corresponding to the outputs of delay elements C1, C2, C3, and C4) at different respective times t1, t2, t3, and t4. Further, element 4 (C0) introduces a delay starting the data reading at the flip-flop input at a time t0. All paths generating a delay greater than delay C0 provide a bit at state 0 since the edge of signal E has not reached them yet. All paths generating a delay shorter than delay C0 generate a bit at state 1 since the edge of signal E arrives on the input of the corresponding flip-flop before delay C0 has expired. In the example of FIG. 2A, at time t0, code 1010 is provided as an identification code.

FIG. 2B illustrates the same circuit coming from a different manufacturing process, and thus providing a different chip. The code obtained therein is different. For example, it is code 0010. In FIG. 2B, a time t5 identical to the case of FIG. 2A has arbitrarily been shown. However, times t'0, t'1, t'2, t'3, and t'4 at which the edge of signal E is at the end of its way through respective paths C0, C1, C2, C3, and C4 are different from the case of FIG. 2A.

It should be noted that delay element C0 is itself sensitive to technological and manufacturing process dispersions. This has however no incidence on the implementation of the present invention since this delay represents an average delay and the searched identification code is arbitrary.

Indeed, to implement the present invention for a physical parameter network identification, what matters is that integrated circuits from a same manufacturing process generate the same code. Since the delay elements are sensitive to manufacturing process dispersions, such will be the case with the implementation of the present invention.

An advantage of the present invention is that the identification is particularly accurate and reliable. In particular, by suppressing the use of a measurement (of voltage or time), the accuracy problems of converters or counters are overcome.

An advantage of this embodiment is that the identification circuit is particularly sensitive. In practice, the detectable difference of the delays introduced by the different paths is on the order of one picosecond. Now, manufacturing process or technological dispersions most often introduce differences on the order of at least some ten picoseconds.

Another advantage is that in case of a drift in time of one of the delays introduced by the elements, this does not affect the circuit results. Indeed, all delay elements being preferably of similar structure, the dispersion will be in the same direction for all elements (paths).

To form the delay elements of the electric paths of the present invention, any integrated element sensitive to technological dispersions or influenced by the manufacturing process may be used. This may be, for example a series of resistors and/or capacitors. For the resistors, resistors across the integrated circuit thickness may be used, but polysilicon resistors, the value of which is linked to their geometry and which have the advantage of being less temperature-dependent will preferably be used.

According to the present invention, an identification phase is triggered by an edge of input signal E. The number of phases depends on the application and on the destination of the identification circuit. If it is a smart card, an identification upon each exchange performed between this card and an external device, even during the same transaction, may for example be provided.

Of course, the present invention is likely to have various alterations, modifications, and improvement which will readily occur to those skilled in the art. In particular, the practical implementation of the delay elements of the present invention may take different forms, provided that they are sensitive to technological and/or manufacturing process dispersions.

Further, the choice of the variation range of the delays introduced by the different elements depends on the application and on the desired sensitivity. This choice is within the ability of those skilled in the art based on the functional indications given hereabove.

Further, it should be noted that the number of bits of the code provided by the circuit to according to the present invention also depends on the desired sensitivity. The higher the number of bits, the more sensitive the circuit will be to code variations.

Finally, different binary code exploitation elements may be provided. Said code may be either stored in a register, or directly exploited to validate or invalidate a function of the circuit in which it is integrated, for example, the supply of this circuit.

Having thus described at least one illustrative embodiment of the invention, various alterations, modifications, and improvements will readily occur to those skilled in the art. Such alterations, modifications, and improvements are intended to be within and scope of the invention. Accordingly, the foregoing description is by way of example only and is not as limiting. The invention is limited only as defined in the following claims and the equivalents thereto.

What is claimed is:

1. An identification circuit of physical parameter network type contained in an integrated circuit chip, the identification circuit comprising:
    a single input terminal of application of a signal for triggering an identification;
    output terminals adapted to providing a binary identification code;
    first electric paths individually connecting said input terminal to each output terminal, each path introducing a delay sensitive to technological and/or manufacturing process dispersions of the integrated circuit; and
    means for simultaneously triggering a storing of binary states present at the outputs of the electric paths.

2. The circuit of claim 1, wherein each electric path is formed of a delay element and of a flip-flop having an input terminal connected at the output of the corresponding delay element and having an output terminal defining one of the output terminals of the identification circuit.

3. The circuit of claim 1, wherein said means for simultaneously triggering the storing include a second electric path introducing a delay approximately corresponding to the average delay of the delays introduced by said first paths, said second path being interposed between said input terminal and a terminal for triggering the storing of said binary states.

4. The circuit of claim 2, wherein clock inputs of the different flip-flops are all connected to said triggering terminal.

5. The circuit of claim 1, wherein the electric paths are chosen to introduce delays of the same order of magnitude, despite technological dispersions.

6. A method for identifying an integrated circuit chip based on physical parameters of at least one electrical element of the integrated circuit chip, the at least one electrical element being sensitive to technological dispersions, wherein the method comprises comparing an average travel duration of a digital signal with respect to travel durations of at least two other electric paths of the same digital signal.

7. The method of claim 6, wherein the comparing is synchronized on the basis of the digital signal.

8. A circuit for providing an identification code, the circuit comprising:
    an input terminal to receive an input signal;
    first delay elements coupled to the input terminal;
    a second delay element coupled to the input terminal; and
    storage elements coupled to the first delay elements and the second delay element;
    wherein the storage elements store the identification code in response to receiving a delayed version of the input signal from the second delay element, the identification code being provided to the storage elements by the first delay elements.

9. The circuit of claim 8, wherein the first delay elements comprise a plurality of delay elements having at least one different delay value.

10. The circuit of claim 8, wherein the circuit is formed on an integrated circuit chip and the first delay elements are sensitive to a technological and/or manufacturing process parameter that varies from being a first value as a result of the integrated circuit being formed in a first integrated circuit manufacturing batch to a second value if the circuit were formed in a different integrated circuit manufacturing batch.

11. The circuit of claim 8, wherein the identification code is encoded in at least one delay value of the first delay elements, the at least one delay value being set upon manufacturing of the circuit.

12. The circuit of claim 8, wherein the first delay elements comprise at least two polysilicon resistors having different delay values.

13. The circuit of claim 8, wherein the storage elements are flip-flops.

14. The circuit of claim 8, wherein the second delay element has a delay approximately equal to an average delay of the first delay elements.

15. The circuit of claim 8, wherein the storage elements are flip-flops that simultaneously store the identification code in response to receiving the delayed version of the input signal from the second delay element.

16. The circuit of claim 15, wherein the flip-flops are D flip-flops that simultaneously store the identification code in response to receiving the delayed version of the input signal at clock inputs of the D flip-flops, the identification code that is stored being based on states of data inputs of the D flip-flops when the delayed version of the input signal is received at the clock inputs, the data inputs of the D flip-flops being coupled to the first delay elements.

17. The circuit of claim 8, wherein the identification code does not change after the circuit is manufactured.

18. The circuit of claim 8, wherein the identification code identifies a batch in which the circuit was manufactured.

19. The circuit of claim 8, wherein the circuit has only a single input terminal.

20. The circuit of claim 8, wherein the entire identification code is stored in the storage elements simultaneously.

21. A method for identifying an integrated circuit chip, the method comprising:
receiving an input signal via first delay elements having delays that are sensitive to at least one technological and/or manufacturing process variable;
receiving the input signal via a second delay element; and
in response to receiving the input signal via the second delay element, storing a digital identification code that identifies the integrated circuit chip, the digital identification code being determined based on the delays of the first delay elements.

22. The method of claim 21, wherein the entire digital identification code is stored simultaneously.

23. The method of claim 21, wherein the digital identification code is encoded in the delays of the first delay elements, the delays being set upon manufacturing of the integrated circuit chip.

24. The method of claim 21, wherein the second delay element has a delay approximately equal to an average of the delays of the first delay elements.

25. The method of claim 21, wherein the digital identification code does not change after the integrated circuit chip is manufactured.

26. The method of claim 21, wherein the digital identification code identifies a batch in which the integrated circuit chip was manufactured.

* * * * *

UNITED STATES PATENT AND TRADEMARK OFFICE
CERTIFICATE OF CORRECTION

PATENT NO. : 7,178,113 B2
APPLICATION NO. : 10/473058
DATED : February 13, 2007
INVENTOR(S) : Michel Bardouillet et al.

It is certified that error appears in the above-identified patent and that said Letters Patent is hereby corrected as shown below:

Claim 21, col. 8, line 7 should read:
--and/or manufacturing process variable--

Signed and Sealed this

Tenth Day of April, 2007

JON W. DUDAS
*Director of the United States Patent and Trademark Office*